(12) United States Patent
Lee

(10) Patent No.: US 6,433,648 B1
(45) Date of Patent: Aug. 13, 2002

(54) METHOD AND STRUCTURE FOR REDUCING THE MUTUAL INDUCTANCE BETWEEN TWO ADJACENT TRANSMISSION LINES ON A SUBSTRATE

(75) Inventor: Chun-Ho Daniel Lee, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 09/542,673

(22) Filed: Apr. 4, 2000

(30) Foreign Application Priority Data

Jan. 12, 2000 (TW) .......................................... 89100398

(51) Int. Cl.[7] ............................................... H03H 7/38
(52) U.S. Cl. ............................................. 333/1; 333/33
(58) Field of Search ............................... 333/1, 12, 112

(56) References Cited

U.S. PATENT DOCUMENTS 5,294,751 A * 3/1994 Kamada ..................... 174/52.4
5,300,749 A * 4/1994 Kotikangas .................. 219/779
6,107,578 A * 8/2000 Hashim ....................... 174/250
6,249,047 B1 * 6/2001 Corisis ......................... 257/691

* cited by examiner

Primary Examiner—Robert Pascal
Assistant Examiner—Joseph Chang
(74) Attorney, Agent, or Firm—J.C. Patents

(57) ABSTRACT

A structure and a method for reducing the mutual inductance between two adjacent transmission lines according to the invention. In the invention, an inverse U-shaped transmission line is located on one side of a transmission line. The corner of a first side of the inverse U-shaped transmission line is bond finger for signal input; the corner of a second side of the inverse U-shaped transmission line is connected to via for signal output. To prevent antenna effect, corners of the inverse U-shaped transmission line are mitered. Furthermore, using computer simulation software, the lengths of the first and second sides of the inverse U-shaped transmission line and the pitches between the first and second sides and the selected transmission line can be adjusted to effectively reduce the mutual inductance therebetween. As a result, cross-talk caused by the mutual inductance can also be eliminated.

14 Claims, 2 Drawing Sheets

METHOD AND STRUCTURE FOR REDUCING THE MUTUAL INDUCTANCE BETWEEN TWO ADJACENT TRANSMISSION LINES ON A SUBSTRATE

CROSS-REFERENCE TO RELATED APPLICATION

This application claims the priority benefit of Taiwan application serial no. 89100398, filed Jan. 12, 2000.

BACKGROUND OF THE INVENTION

1. Field of the Invention

The invention relates to a structure of a printed circuit board or a ball grid array (BGA) board for greatly reducing the mutual inductance between two adjacent transmission lines on a substrate.

2. Description of the Related Art

Currently, devices on the main board of a personal computer at least includes a central processing unit (CPU). If the main board has a multi-processing function, it can include more than one CPU. In addition to CPU, the main board has an accelerated graphics port (AGP) connected to a display card, memory slots for the insertion of modular memories and peripheral component interconnects (PCI) for installation of various interface cards. Furthermore, anther control circuit is mostly designed in a chip set which must be connected to the CPU, memories, AGP slots and PCI slots. The arrangement of the pins of the chip set with respect to the positions of other devices must be taken into account. Especially, data processed by the CPU all are 32-bit or more than 32-bit data. Therefore, there are several hundreds of transmission lines among the chip set, CPU, memories, AGP slots and PCI slots. On the other hand, since the clock frequency of the CPU is as high as several hundred MHz, it should be careful during the circuit layout of the main board to ensure the main board stability.

A part of the prior art for a ball grid array (BGA) board or a printed circuit board layout is shown in FIG. 1A. A chip set, such as Intel-made chip set 440BX, is mounted on the above conventional ball array board or the printed circuit board. Generally, the chip set has a square flat package with a thickness of several millimeters. Moreover, there are two square planes on both sides of the chip set, wherein one has electrical balls and the other is printed with a text label. In FIG. 1A, transmission lines 11, 12, 13 are parallel to one another on a conventional printed circuit board. The mutual inductance of any two adjacent transmission lines has a logarithmic relation with pitch. Therefore, even though the distance between two adjacent transmission lines is increased, the corresponding mutual inductance can not be effectively reduced. Furthermore, since the clock frequency of a currently used CPU is over several hundred MHz, the mutual inductance of the transmission lines 2 and 3 and transmission lines 2 and 1 becomes more serious. In turn, the mutual inductance then causes a cross-talk effect, resulting in a data error.

AS shown in FIG. 1A, reference symbols L1, Ls, L2 represent the self-inductance of transmission line 11, 12, 13, respectively, and reference symbol Lm represents the mutual inductance between the transmission line 12 and 13 and between transmission lines 12 and 11. Each transmission line has a width of 80 $\mu$m. The pitchs between the transmission lines 11 and 12 and between the transmission lines 12 and 13 is 200 $\mu$m and 70 $\mu$m, respectively. The lengths of the transmission lines 11, 13 and the transmission line 12 are 10000 $\mu$m, 10000 $\mu$m and 3000 $\mu$m, respectively. The transmission line 12 is used for a high-frequency signal line, such as a clock signal. The reason that the length of line 12 equal to 3000 $\mu$m is based on the requirement of PC design. On end of line 12 is bond finger; the other end is via which connects with ball. The same to line 11 and line 13. The self-inductance Ls of the transmission lines 11, 12, 13 and the mutual inductance Lm between the transmission lines 12 and 11 and between the transmission lines 12 and 13 obtained by using Ansoft-Spicelink simulation software at f=100 MHZ are shown in Table 1.

TABLE 1

| Ls | Lm1 | Lm2 | L1 | L2 |
|---|---|---|---|---|
| 1.51 | 0.539 | 0.788 | 5.84 | 5.77 |

Unit: nH

As can be seen from Table 1, since the pitch between the transmission lines 12 and 13 is only 70 $\mu$m, the mutual inductance Lm2, 0.788 nH, between the transmission lines 12 and 13 is larger than the mutual inductance Lm1, 0.539 nH, between transmission lines 11 and 13. Generally, cross talk is related to the ratio of self-inductance and mutual inductance. From Table 1, the ratio of mutual inductance and self-inductance Lm1/Ls and Lm2/Ls is 0.357 and 0.522, respectively.

Referring now to FIG. 1B, the pitches between the transmission lines 11 and 12 and between the transmission lines 12 and 13 is adjusted to 145 $\mu$m. The width and length of each line are not changed. The self-inductance Ls of the transmission lines 11, 12, 13 and the mutual inductance Lm between the transmission lines 12 and 11 and between the transmission line 12 and 13 obtained by Ansoft-Spicelink simulation software are shown in Table 2.

TABLE 2

| Ls | Lm1 | Lm2 | L1 | L2 |
|---|---|---|---|---|
| 1.58 | 0.655 | 0.655 | 5.87 | 5.87 |

Unit: nH

As can be seen from Table 2, since the pitches between the transmission line 12 and 11 and between the transmission line 12 and 13 all are 145 $\mu$m, the mutual induction Lm1 of the transmission line 11 is the same to the mutual inductance Lm2, that is, Lm1=Lm2=0.655 nH, wherein Lm1/Ls=Lm2/Ls=0.414.

Next, referring to FIG. 1C, the pitch between the transmission lines 11 and 12 is 70 $\mu$m and the pitch between the transmission lines 12 and 13 is 220 $\mu$m. The width and the length of each line are kept. The self-inductance Ls of the transmission lines 11, 12, 13 and the mutual inductance Lm between the transmission lines 12 and 11 and between the transmission line 12 and 13 obtained by Ansoft-Spicelink simulation software are shown in Table 3.

TABLE 3

| Ls | Lm1 | Lm2 | L1 | L2 |
|---|---|---|---|---|
| 1.51 | 0.788 | 0.539 | 5.77 | 5.84 |

Unit: nH

From Table 3, as the pitch between the transmission lines 12 and 13 is increased to 220 $\mu$m, the mutual inductance Lm2 between transmission lines 12 and 13 is reduced to 0.539 nH. Furthermore, Lm1/Ls=0.522 and Lm2/Ls=0.357. As described above, after the pitch between the transmission lines 12 and 13 is increased from 70 $\mu$m to 220 $\mu$m, Lm2/Ls is just slightly reduced from 0.522 to 0.357. Even though the pitch between two adjacent transmission lines is 3 times larger, the mutual inductance Lm2 can not be efficiently reduced to eliminate cross-talk effect.

In summary, the layout of a conventional ball grid array board or printed circuit board has the following disadvantages: the mutual inductance between two adjacent transmission lines can not be effectively reduced. In particular, when the clock frequency of a CPU is as high as several hundred MHz, the mutual inductance between two adjacent transmission lines will become much more serious.

SUMMARY OF THE INVENTION

In view of the above, the invention is to provide a method and a structure for reducing the mutual inductance between two adjacent transmission lines. Even though the pitch between any two adjacent transmission lines is the same, the mutual inductance between them can be almost eliminated.

A structure for reducing the mutual inductance between two adjacent transmission lines on a substrate according to the invention includes an inverse U-shaped transmission line. One terminal is bond finger for signal input; the other is via for signal output. The length of these two sides of the inverse U-shaped line is different. The side adjacent to sensitive trace is shorter. Furthermore, corners of the inverse U-shaped transmission line are mitered to prevent antenna effect. With such structure stated above, mutual inductance and cross-talk can be effectively reduced.

A method for reducing the mutual inductance between two adjacent transmission lines on a substrate is as follows: (1) designing an inverse U-shaped transmission line which has a first side, a second side and a base; (2) keeping the positions of bond finger and via; and (3) optimizing the lengths of the first side and the second side, the base length, and the pitch between this line and adjacent sensitive line to get minimum mutual inductance by simulation.

BRIEF DESCRIPTION OF THE DRAWINGS

The invention will be understood easily from the detailed description given hereinafter and the accompanying drawings which are given by way of illustration only, and thus do not limit the present invention, and wherein.

DETAILED DESCRIPTION OF THE PREFERRED EMBODIMENTS

Figure 1A:
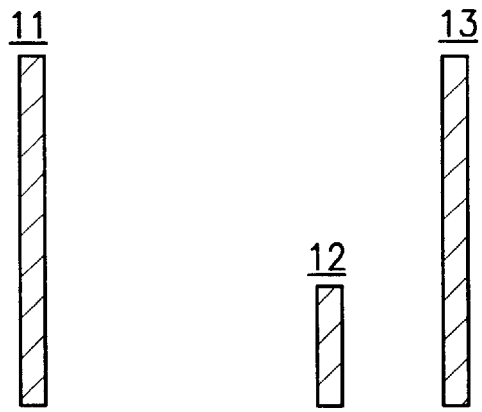
FIGS. 1A~1C are schematic views each showing a conventional layout of a ball grid array board or a printed circuit board.
Figure 1B:
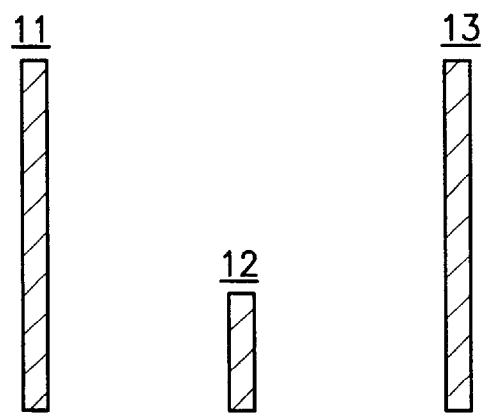
Figure 1C:
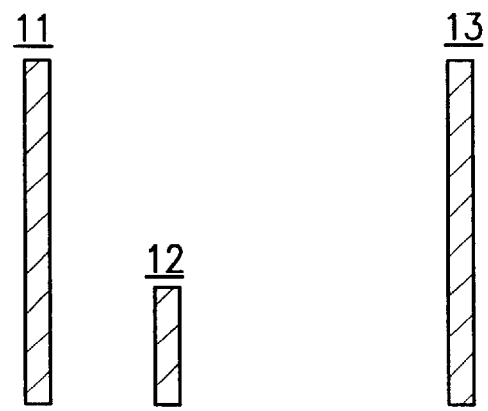
Figure 2A:
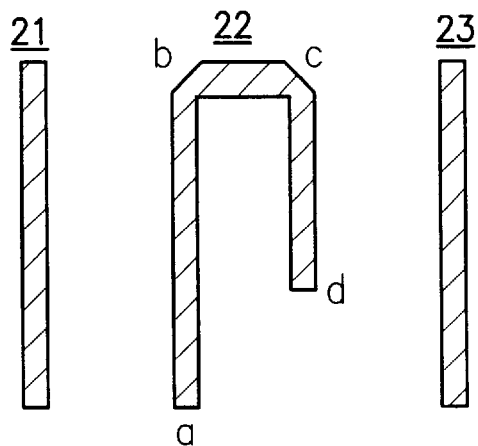
FIG. 2A is a schematic view showing a structure for reducing the mutual inductance between two adjacent transmission lines on a substrate according to a first preferred embodiment of the invention.

Referring to FIG. 2A, a structure for reducing the mutual inductance between two adjacent transmission lines on a substrate according to a first preferred embodiment of the invention is shown. The substrate can be a printed circuit board or a ball grid array package. The structure for reducing the mutual inductance between two adjacent transmission lines includes two transmission lines 21, 23 and an inverse U-shaped transmission line 22. Two transmission lines 21, 23 are located on both sides of the inverse U-shaped transmission line 22. The inverse U-shaped transmission line 22 has a first side ab electrically connected to a first terminal and a second side cd electrically connected to a second terminal. A is for bond finger, and d is via. The pitches between the transmission lines 22 and transmission lines 21, 23 are 70 $\mu$m. The lengths of the first side ab and the second side cd of the transmission line 22 are 10000 $\mu$m and 7000 $\mu$m, respectively. A base bc of the transmission line 22 has a length of 70 $\mu$m. Like the prior art, the transmission line 22 is also connected to a via at the position of 3000 $\mu$m. The pitch between the first side ab and the transmission line 21 is longer than that between the second side cd and the sensitive line 23. Moreover, corners of the base bc of the inverse U-shaped transmission line 22 is mitered to prevent antenna effect. The pitch between the second side cd arid the sensitive line 23 is approximately in the range of 40~100 $\mu$m. The ratio of the second side cd and the first side ab in length is approximately in the range of 1/5~4/5. The length of the base bc is approximately 40~100 $\mu$m. With such structure stated above, the mutual induction between the inverse U-shaped transmission line 22 and the sensitive line 23 and cross talk caused by the mutual inductance can be effectively reduced.

In other words, the inverse U-shaped transmission line 22 for high-frequency transmission is located between the transmission lines 21, 23. Assume that the sensitive line 23 is more sensitive to the high-frequency signal, and therefore the mutual inductance can be effectively reduced by optimizing the lengths of the first and second sides ab, cd of the inverse U-shaped transmission line 22 and the pitches between the first and second sides and the sensitive line 23. As shown in FIG. 2A, the second side cd of the inverse U-shaped transmission line 22 is smaller and has a shorter pitch with the sensitive line 23 while the first side ab of the inverse U-shaped transmission line 22 is longer and has a larger pitch with the sensitive line 23. The mutual inductance is directly proportional to the trace length and inversely to the pitch. Besides, the current flow is inverse on the both sides. With such arrangement and the assistance of Ansoft Spicelink simulation software, the lengths of the first and second sides ad, cd and the pitches between the first and second sides and the sensitive line 23 can be adjusted to make the magnetic field induced by the first and second sides ab, cd cancel each other, because the directions of currents flowing through the first side ab and the second side cd is opposite. The mutual inductance caused by the first side ab and the second cd can be cancelled with each other. That is, according to the structure of the invention, the mutual inductance between the inverse U-shaped transmission line 22 and the sensitive line 23 and cross-talk caused by the mutual inductance can be effectively reduced.

Referring to Table 4, it shows the self-inductance Ls and the mutual inductance Lm obtained by Ansoft-Spicelink simulation software, wherein the pitches between the transmission lines 21, 23 and the transmission line 22 are 70 $\mu$m, the lengths of the first and second sides ab, cd of the transmission line 22 are 10000 $\mu$m and 7000 $\mu$m, respectively and the length of the base bc is 70 $\mu$m.

TABLE 4

| Ls | Lm1 | Lm2 | L1 | L2 |
|---|---|---|---|---|
| 5.44 | 1.37 | 0.0197 | 5.64 | 5.68 |

Unit: nH

As shown in Table 4, the mutual inductance Lm2 between the sensitive line 23 and the inverse U-shaped transmission line 22 is 0.0197nH, Lm1/Ls=0.252 and Lm2/Ls=0.004. Compared to the prior art, Lm2 having a value of 0.0197 is much closer to zero, and Lm1/Ls and Lm2/Ls are decreased from 0.357, 0.522 to 0.252, 0.004. Especially, the reduction of Lm2 is very significant.

Figure 2B:
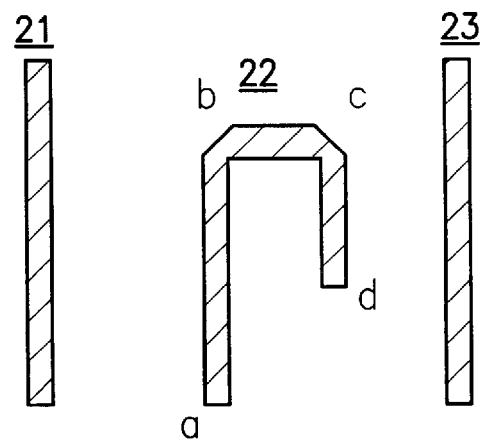
FIG. 2B is a schematic view showing a structure for reducing the mutual inductance between two adjacent transmission lines on a substrate according to a second preferred embodiment of the invention.
Figure 2C:
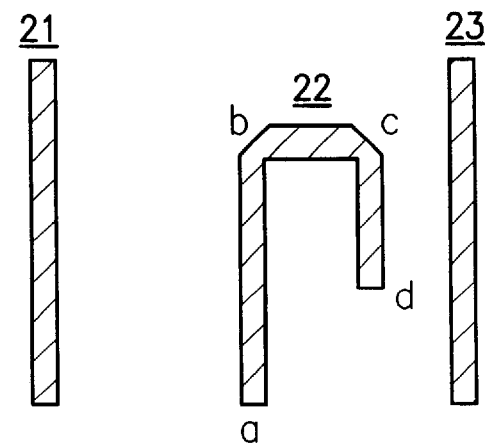
FIG. 2C is a schematic view showing a structure for reducing the mutual inductance between two adjacent transmission lines on a substrate according to a third preferred embodiment of the invention.

FIGS. 2B and 2C are utilized to illustrate how the method works. In FIG. 2B, a structure for reducing the mutual inductance between two adjacent transmission lines on a substrate according to a second preferred embodiment of the invention is shown. The pitches between the transmission lines 21,23 and the inverse U-shaped transmission line 22 are 70 $\mu$m. The lengths of the first and second sides ab, cd of the inverse U-shaped transmission line 22 are 7000 $\mu$m and 4000 $\mu$m.

Table 5 shows the self-inductance Ls and the mutual inductance Lm of the stated structure obtained by Ansoft-Spicelink simulation software.

TABLE 5

| Ls | Lm1 | Lm2 | L1 | L2 |
|---|---|---|---|---|
| 3.83 | 1.2 | 0.293 | 5.69 | 5.73 |

Unit: nH

As shown in Table 5, the mutual inductance Lm2 between the sensitive line 23 and the inverse U-shaped transmission line 22 is 0.293 nH, Lm1/Ls=0.313 and Lm2/Ls=0.076. Compared to Table 1 of the prior art, Lm2 is reduced from 0.788 to 0.293, and Lm1/Ls and Lm2/Ls are decreased from 0.357, 0.522 to 0.313, 0.076, respectively.

FIG. 2C is the same to FIG. 2B except the pith is reduced from 70 $\mu$m to 50 $\mu$m. And the simulation results is shown in Table 6.

TABLE 6

| Ls | Lm1 | Lm2 | L1 | L2 |
|---|---|---|---|---|
| 3.74 | 1.13 | 0.21 | 5.61 | 5.63 |

Unit: nH

From Table 6, the mutual inductance Lm2 between the sensitive line 23 and the inverse U-shaped transmission line 22 is 0.21 nH, Lm1/Ls=0.302 and Lm2/Ls=0.056. Compared to Table 5, though the pitch between this line and line 23 is reduced, the mutual inductance is smaller. Obviously, this result of the third preferred embodiment is opposite to that of the prior art. The better result will be obtained if the pitch between the second side ab and the sensitive line 23 can be further reduced. Accordingly, the minimum mutual inductance can be obtained by optimizing these variables.

A method for reducing the mutual inductance between two adjacent transmission lines on a substrate, such as a printed circuit board or a ball grid array package, includes the following steps. First, an inverse U-shaped transmission line having a first side, a second side and a base is located on one side of a transmission line, wherein the pitch between the first side and the transmission line is longer than that between the second side and the transmission line. Then, the lengths of the first side and the second side, the pitches between the first and second sides and the transmission line are adjusted using a computer simulation software, such as Ansof Spicelink, to effectively reduce the mutual inductance between the inverse U-shaped transmission line and the transmission line.

The inverse U-shaped transmission line has a high-frequency signal, such as a lock signal of more than 100 MHz, flowing through. Moreover, the pitch between the first side of the inverse U-shaped transmission line 22 and the transmission line is in the range of 40~100 $\mu$m. The ratio of the second side to the first side in length is approximately in the range of 1/5~4/5. The length of the base is approximately 40~100. One corner of the base is mitered to reduce an antenna effect. With such method, the mutual inductance between the inverse U-shaped and cross-talk caused by the mutual inductance can be effectively reduced.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A structure for reducing the mutual inductance between two adjacent transmission lines on a substrate, comprising:

an inverse U-shaped transmission line located between a first and second transmission lines, the U-shaped transmission line having a first side connected to a bond finger and a second side connected to a via, wherein the pitch between the first side and the first transmission line is longer than that between the second side and the second transmission line.

2. The structure of claim 1, wherein the substrate is a printed circuit board.

3. The structure of claim 1, wherein the substrate is a printed circuit board of a ball grid array (BGA) package.

4. The structure of claim 1, wherein the second transmission line is more sensitive to high frequency signals.

5. The structure of claim 1, wherein the pitch between the second side and the transmission line is between 40 to 100 $\mu$m.

6. The structure of claim 1, wherein the ratio of the second side to the first side in length is in the range of 1/5~4/5.

7. The structure of claim 1, wherein one corner of a base of the inverse U-shaped transmission line is mitered to eliminate antenna effect.

8. The structure of claim 7, wherein the length of the base is 40~100 $\mu$m.

9. A method for reducing the mutual inductance between two adjacent transmission lines on a substrate, comprising:

designing an inverse U-shaped transmission line which has a first side, a second side and a base, located between a first and second transmission lines; and adjusting the lengths of the first side and the second side, and the pitches between the first and second sides and the first and second transmission lines thereby effectively reducing the mutual inductance between the transmission lines.

10. The method of claim 9, wherein the second transmission line is more sensitive to high-frequency signals.

11. The method of claim 9, wherein the ratio of the second side to the first side in length is in the range of 1/5~4/5.

12. The method of claim 9, wherein the pitch between the first side and the transmission line is in the range of 40~100 $\mu$m.

13. The method of claim 9, wherein one corner of the base is mitered to eliminate antenna effect.

14. The method of claim 9, wherein the length of the base is in the range of 40~100 $\mu$m.

* * * * *